US006196298B1

(12) United States Patent
Shaw

(10) Patent No.: US 6,196,298 B1
(45) Date of Patent: Mar. 6, 2001

(54) HEAT SINK

(75) Inventor: Michael C. Shaw, Wolverhampton (GB)

(73) Assignee: IMI Marston Limited, Wolverhampton (GB)

( * ) Notice: Subject to any disclaimer, the term of this patent is extended or adjusted under 35 U.S.C. 154(b) by 0 days.

(21) Appl. No.: 09/045,786

(22) Filed: Mar. 23, 1998

(51) Int. Cl.[7] .......... H05K 7/20

(52) U.S. Cl. .......... 165/80.3; 165/185; 361/704

(58) Field of Search .......... 165/80.3, 185; 361/704, 710; 257/722

(56) References Cited

U.S. PATENT DOCUMENTS 2,289,984 * 7/1942 Mouromtseff et al. .......... 165/80.3 X
2,680,009 * 6/1954 Nekut .......... 165/80.3
4,689,659 * 8/1987 Watanabe .......... 257/722
4,785,216 11/1988 Roberts et al. .......... 313/32
5,561,338 10/1996 Roberts et al. .......... 313/46
5,785,116 * 7/1998 Wagner .......... 165/80.3

FOREIGN PATENT DOCUMENTS

3151838 A1 7/1983 (DE) .
0 751 339 A2 1/1997 (EP) .

* cited by examiner

*Primary Examiner*—Allen Flanigan
(74) *Attorney, Agent, or Firm*—Pillsbury Madison & Sutro LLP

(57) ABSTRACT

A heat sink particular suitable for dissipating heat from lamps. The sink is circular in cross-section having a central core and radial fins extending at an angle to a plane extending through the axis of the core.

2 Claims, 2 Drawing Sheets

HEAT SINK

FIELD OF THE INVENTION

This invention relates to a heat sink, particularly a heat sink to dissipate heat from a lamp, camera or the like.

BACKGROUND OF THE INVENTION

The invention will for convenience be more specifically described below with particular reference to a lamp although it will be appreciated that it is not intended to be so limited and, indeed, has widespread applicability.

Heat sinks to dissipate heat from lamps and the like are well known and it is an object of the present invention to provide a heat sink that can improve heat dissipation from a source while maintaining or reducing the overall size of the heat sink. Thus, in comparison with prior heat sinks, the invention enables an increase in the effective surface area available for heat dissipation within a given overall volume.

SUMMARY OF THE INVENTION

Accordingly the invention provides a heat sink comprising a cylindrical core of thermally conducting material and an array of spaced, heat dissipating fins extending around and attached to the outer surface of the core, the fins being disposed at an angle to the longitudinal axis of the core and the heat sink containing a recess to accommodate a portion of the body requiring heat dissipation whereby the body can be in contact with the core.

The recess is preferably shaped and sized to receive the body closely to ensure good contact between the body and the core to maximise the heat dissipation effect.

The core is preferably of copper although other good thermal conductors, e.g. aluminium or silver, may be used if desired.

The recess may be in the core itself. In this embodiment the recess may extend for the whole of the axial length of the core, i.e. the core may be an annulus, and the recess is in fact a through passage, or it may extend only partially along the length of the core. In this latter embodiment the core may be a solid cylindrical bar of, e.g. copper, having an integral hollow annular portion at one end to define the recess. Alternatively, the recess may be defined by the fins only. Thus the fins may extend axially beyond the core to define the recess. In this case, the only direct contact between the lamp or other body and the core is an end to end contact at the inner end of the recess and there may also be direct contact between the lamp and the fins. Preferably in this latter embodiment, the recess defined by the fins shares a longitudinal axis with the core and hence extends centrally in the heat sink.

The fins, which are preferably of the same material as the core, may be attached to the core by any suitable means. Thus adhesives or low temperature soldering or high temperature brazing may be used for copper and adhesives or vacuum brazing may be used for aluminium. Suitable adhesives include resin-based adhesives, e.g. epoxy resins. To achieve the desired angling of the fins, correspondingly angled slots may, for example, be machined on the surface of the core, each slot to receive an edge of a fin. Alternatively, the core may be formed by casting with appropriate slots. It may be preferable to cast the core and fins or a proportion of the fins, e.g. alternate fins, as an integral body. Thus, for example, a repeating array of fin then slot then fin may be cast with alternate separate fins then being adhered into the slots.

The angle of the fins to the longitudinal axis of the core may be, for example from 30° to 75°, especially from 40° to 60°.

In one embodiment the fins have an axial extent (relative to the core) equal to the length of the core and are co-extensive axially with the core. However, this is not essential and, if desired, the fins may extend beyond one or both ends of the core. Indeed, as indicated above, this arrangement in which the fins extend beyond one end of the core forms one particular embodiment of the invention when the core is a solid bar.

It will be appreciated that when a lamp or other heat source is positioned in the recess, that portion of the surface of the lamp within the recess is surrounded by the core and/or the fins and is in contact with the core and possibly the fins. Thus heat is rapidly and effectively passed by conduction through the core to the fins with, possibly, some conduction directly to the fins as indicated above, and thereby dissipated to atmosphere. The angled arrangement of the fins enables the effective surface area through which the heat is dissipated to be maximised for a given overall volume of heat sink.

The heat sink may, of course, be used in conjunction with other means conventionally used to dissipate the heat transmitted through the fins, e.g. forced draughts of air.

As indicated above, although the invention is described herein with particular reference to lamps, it is applicable to a variety of other heat sources, e.g. lasers, studio lighting and, particularly, any cylindrically-shaped heat source. Thus the recess will normally be cylindrical although other shapes of recess may be provided, if desired, to match other shapes of heat sources.

BRIEF DESCRIPTION OF THE DRAWINGS

Embodiments of the invention will now be described by way of example only with reference to the accompanying drawings in which:

FIGS. 5A and 5B illustrate other embodiments of the Invention.

FIG. 5A illustrates an embodiment wherein the core 12 itself provides the recess 16 to receive the lamp or other body 18. In this case, the core is an annulus and the recess 16 comprises a passage through the length of the core. Fins 14 at an angle to the longitudinal axis of the core are provided as in other embodiments.

Figure 1:
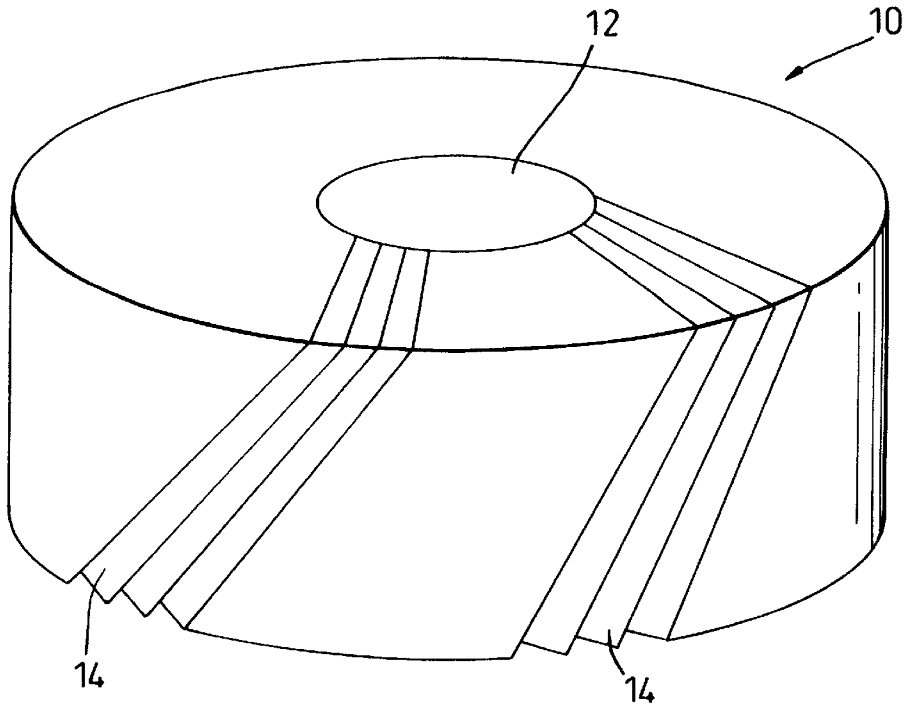
FIG. 1 is a diagrammatic illustration in perspective view of a heat sink of the invention showing a portion only of the fins.
Figure 2:
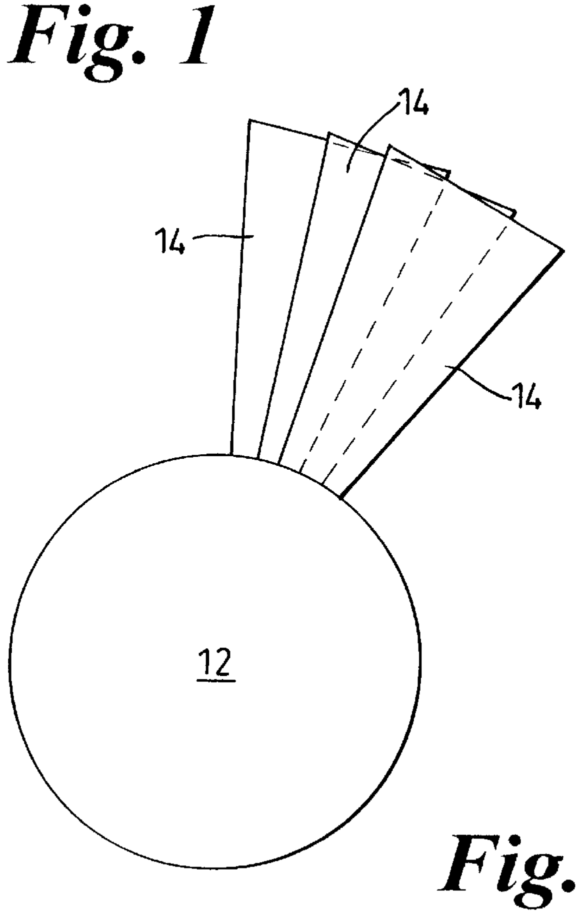
FIG. 2 is an end elevation of the heat sink of FIG. 1 with most of the fins removed for clarity.
Figure 3:
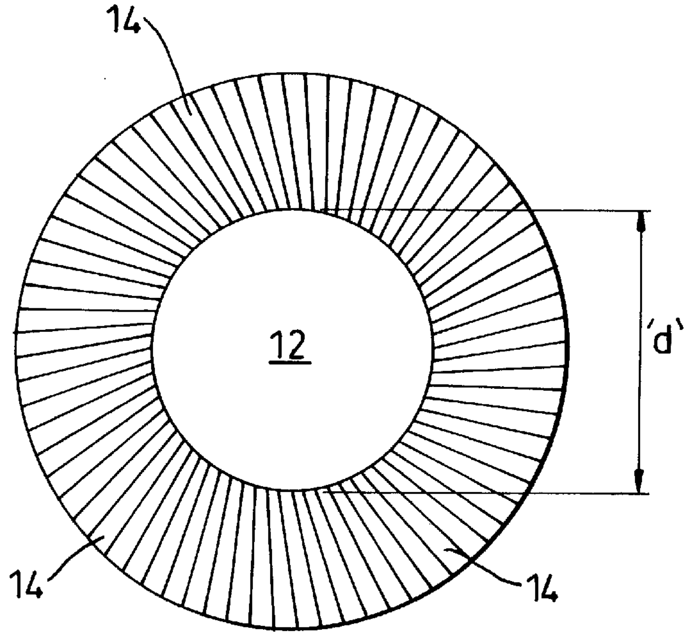
FIG. 3 is an end elevation of the complete heat sink.

In the modification of FIG. 5B, the core 12, with fins 14, may be a solid cylindrical bar which has a hollow annular portion at one end to define the recess and receive the lamp or other body 18.

DESCRIPTION OF THE PREFERRED EMBODIMENTS

In the drawings heat sink 10 comprises a cylindrical core 12 of copper having attached to its outer surface an array of fins 14. Fins 14 lie at an angle $\alpha°$ to the longitudinal axis of core 12. Although in principle $\alpha$ may be any number between 0° and 90°, as indicated above, it is preferred to be from 30° to 75°. The edges of the fins in contact with the core lie in slots (not shown) into which they have been adhered.

Figure 4:
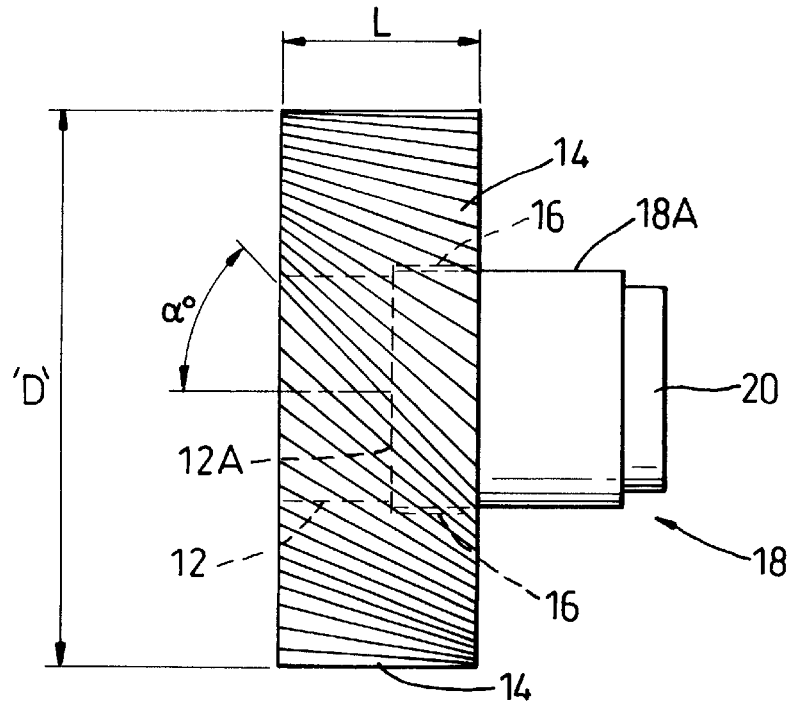
FIG. 4 is a side elevation of the heat sink showing a lamp in position in its recess.

As shown in FIG. 4, fins 14 extend longitudinally beyond the core 12 and form a recess 16 axially contiguous with the core. A lamp 18 has a body portion 18A and a lens 20. Body portion 18A is of size to extend into the recess and closely fill it. The end face of the lamp body portion inside the recess is in contact with end face 12A of the core 12 to ensure good heat transference from the lamp to the core and the fins.

By way of example only, a core of about 76 mm diameter "d" may have from 50 to 120 fins attached to its outer surface and the overall diameter "D" of the heat sink may be about 150 mm and its length "L" about 55 mm, the copper core being about 25 to 30 mm in length. Thus a very efficient and effective heat sink performance can be achieved from a heat sink of relatively compact overall dimensions. However, it will be appreciated that the dimensions and fin numbers and angles can vary widely depending on the specific circumstances and performance requirements.

What is claimed is:

1. A heat sink comprising a cylindrical core of thermally conducting material and an array of spaced, heat dissipating fins extending around and attached to the outer surface of the core, the fins being disposed at an angle to the longitudinal axis of the core and the heat sink containing a recess of a shape and size sufficient to receive a portion of the body requiring heat dissipation whereby the body can be in contact with the core wherein the recess is in the core the core being an annulus and the recess being a passage through the annulus.

2. A heat sink comprising a cylindrical core of thermally conducting material and an array of spaced, heat dissipating fins extending around and attached to the outer surface of the core, the fins being disposed at an angle to the longitudinal axis of the core and the heat sink containing a recess of a shape and size sufficient to receive a portion of the body requiring heat dissipation whereby the body can be in contact with the core, the core being a solid bar having an integral hollow annular portion at one end to recess.

* * * * *